(12) United States Patent
Kim et al.

(10) Patent No.: US 10,554,211 B2
(45) Date of Patent: Feb. 4, 2020

(54) DATA RECEIVER CIRCUIT

(71) Applicants: SK hynix Inc., Gyeonggi-do (KR);
Seoul National University R&DB Foundation, Seoul (KR)

(72) Inventors: Suhwan Kim, Seoul (KR);
Deog-Kyoon Jeong, Seoul (KR);
Sang-Yoon Lee, Seoul (KR);
Joo-Hyung Chae, Seoul (KR);
Chang-Ho Hyun, Seoul (KR)

(73) Assignees: SK hynix Inc., Gyeonggi-do (KR);
Seoul National University R&DB Foundation, Seoul (KR)

( * ) Notice: Subject to any disclaimer, the term of this patent is extended or adjusted under 35 U.S.C. 154(b) by 0 days.

(21) Appl. No.: 16/237,040

(22) Filed: Dec. 31, 2018

(65) Prior Publication Data

US 2019/0268005 A1    Aug. 29, 2019

(30) Foreign Application Priority Data

Feb. 28, 2018   (KR) .......................... 10-2018-0024438

(51) Int. Cl.
*H04L 7/033* (2006.01)
*H03L 7/089* (2006.01)
(Continued)

(52) U.S. Cl.
CPC ............ *H03L 7/0891* (2013.01); *H03L 7/087* (2013.01); *H04L 7/0004* (2013.01); *H04L 7/033* (2013.01)

(58) Field of Classification Search
CPC ..... H03L 7/0891; H03L 7/087; H04L 7/0004; H04L 7/033; H04L 7/0331; H04L 7/0338; H04L 7/0066; H04L 7/0337
See application file for complete search history.

(56) References Cited

U.S. PATENT DOCUMENTS

2003/0118138 A1* 6/2003 Chow ................... G11C 27/02
375/355
2007/0217559 A1* 9/2007 Stott .................... G11C 7/1051
375/355
(Continued)

FOREIGN PATENT DOCUMENTS

KR        100714382        5/2007

*Primary Examiner* — Ted M Wang
(74) *Attorney, Agent, or Firm* — IP & T GROUP LLP

(57) ABSTRACT

A data receiver circuit may include: a delay circuit suitable for delaying first and second strobe signals and generating delayed first and second strobe signals; a first receiver circuit suitable for sampling data in synchronization with the delayed first strobe signal; a second receiver circuit suitable for sampling the data in synchronization with the delayed second strobe signal; an enable signal generation circuit suitable for generating an enable signal indicating whether the data transitioned; a transition level generation circuit suitable for generating a transition level signal indicating a transition direction of the data; a phase shift circuit suitable for shifting the phase of the delayed first strobe signal by a set degree and generating a shifted first strobe signal; a sampling circuit suitable for sampling the data in synchronization with the shifted first strobe signal and generating a sampling result; and a control logic suitable for changing a delay value of the delay circuit in response to the transition level signal and the sampling result of the sampling circuit, when the enable signal is activated.

19 Claims, 4 Drawing Sheets

(51) Int. Cl.
*H04L 7/00* (2006.01)
*H03L 7/087* (2006.01)

(56) References Cited

U.S. PATENT DOCUMENTS

2014/0281328 A1* 9/2014 Pandey .................. G11C 7/227
                                                        711/167
2014/0333353 A1   11/2014 Kang

* cited by examiner

DATA RECEIVER CIRCUIT

CROSS-REFERENCE TO RELATED APPLICATION

This application claims priority under 35 U.S.C. § 119 to Korean Patent Application No. 10-2018-0024438, filed on Feb. 28, 2018, which is incorporated herein by reference in its entirety.

BACKGROUND

1. Field

The present invention relates to a data receiver circuit which receives data using a strobe signal.

2. Discussion of the Related Art

Integrated circuits, which may be used to implement memory system components, exchange data. In order to exchange data at high speed, integrated circuits require a strobe signal to correctly recognize associated data. Therefore, when exchanging data at high speed, the integrated circuits exchange the strobe signal as well as the data.

For example, most memory devices exchange a strobe signal for strobing data, while exchanging the data. For a stable data transmitting and receiving operation, the data must be correctly aligned with the strobe signal. FIG. 1 illustrates that strobe signals used in memory devices are aligned with data, that is, edges of strobe signals DQS_t and DQS_c are aligned with the centers of data DQ. For the alignment between the data DQ and the strobe signals DQS_t and DQS_c, as shown in FIG. 1, a training process between a memory device and a memory controller may be performed during an initialization process of the memory device. After the training process, however, the alignment may be distorted by a process, voltage and temperature (PVT) variation over time. Therefore, there is a need for a technique for aligning the data and the strobe signal, after the training process.

SUMMARY

Various embodiments are directed to a technique for aligning data and a strobe signal, particularly in integrated circuits.

In an embodiment, a data receiver circuit may include: a delay circuit suitable for delaying first and second strobe signals and generating delayed first and second strobe signals; a first receiver circuit suitable for sampling data in synchronization with the delayed first strobe signal; a second receiver circuit suitable for sampling the data in synchronization with the delayed second strobe signal; an enable signal generation circuit suitable for generating an enable signal indicating whether the data transitioned; a transition level generation circuit suitable for generating a transition level signal indicating a transition direction of the data; a phase shift circuit suitable for shifting the phase of the delayed first strobe signal by a set degree and generating a shifted first strobe signal; a sampling circuit suitable for sampling the data in synchronization with the shifted first strobe signal and generating a sampling result; and a control logic suitable for changing a delay value of the delay circuit in response to the transition level signal and the sampling result of the sampling circuit, when the enable signal is activated.

In another embodiment, a circuit may include: a delay circuit suitable for delaying first and second strobe signals by a set delay value and generating delayed first and second strobe signals; a receiver circuit suitable for sampling data in synchronization with the delayed first strobe signal, and sampling the data in synchronization with the delayed second strobe signal; a phase shift circuit suitable for shifting the phase of the delayed first strobe signal by a set degree and generating a shifted first strobe signal; a sampling circuit suitable for sampling the data in synchronization with the shifted first strobe signal and generating a sampling result; and a control logic suitable for controlling the delay value of the delay circuit based on the sampling result of the sampling circuit when the data transitioned.

DETAILED DESCRIPTION

Figure 1:
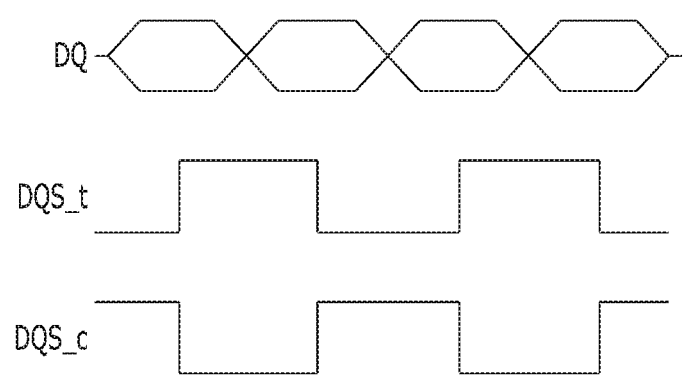
FIG. 1 illustrates that strobe signals are aligned with data.

Various embodiments will be described below in more detail with reference to the accompanying drawings. The present invention may, however, be embodied in different forms and configurations. Thus, the present invention is not limited to the embodiments set forth herein. Rather, these embodiments are provided so that this disclosure is thorough and complete and fully conveys the scope of the present invention to those skilled in the art. Throughout the disclosure, like reference numerals refer to like parts throughout the various figures and embodiments of the present invention. Also, throughout the specification, reference to "an embodiment," "another embodiment," or the like is not necessarily to only one embodiment, and different references to any such phrase are not necessarily to the same embodiment(s).

Figure 2:
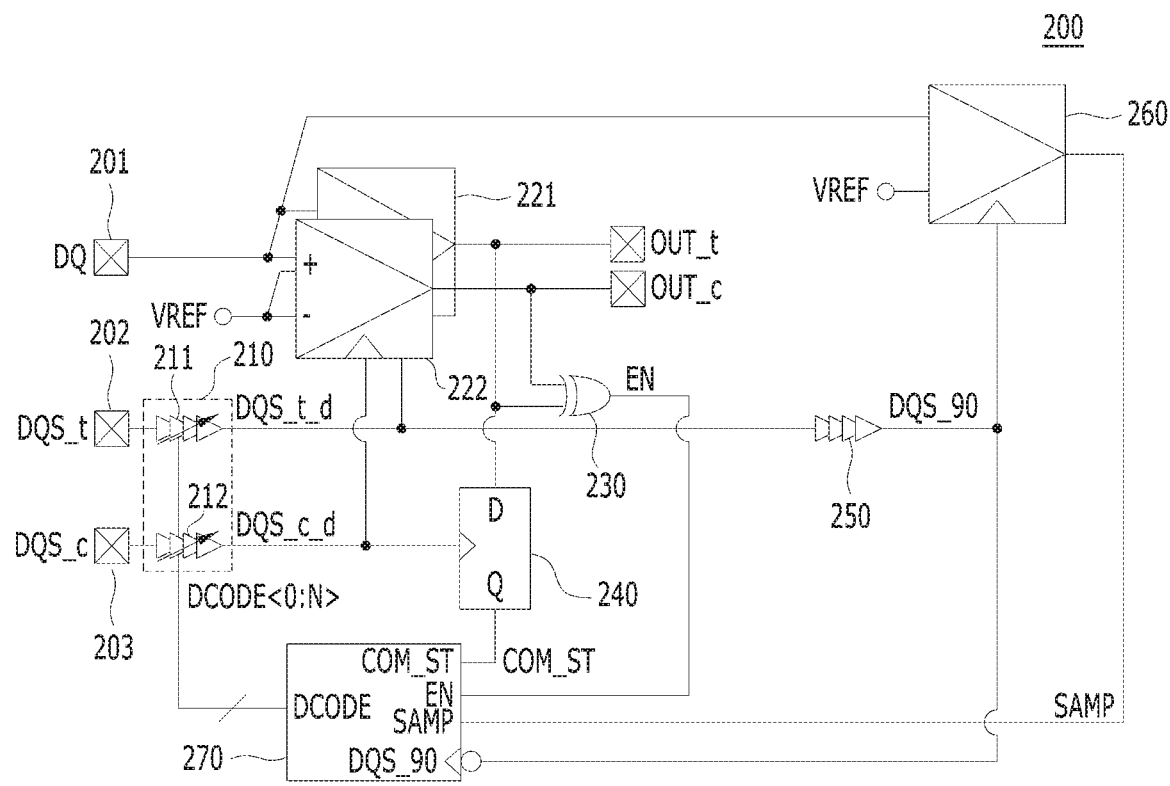
FIG. 2 is a diagram illustrating a data receiver circuit in accordance with an embodiment of the present invention.

FIG. 2 is a diagram illustrating a data receiver circuit 200 in accordance with an embodiment.

Referring to FIG. 2, the data receiver circuit 200 may include a delay circuit 210, a first receiver circuit 221, a second receiver circuit 222, an enable signal generation circuit 230, a transition level generation circuit 240, a phase shift circuit 250, a sampling circuit 260 and a control logic 270.

The delay circuit 210 may generate delayed first and second strobe signals DQS_t_d and DQS_c_d by delaying first and second strobe signals DQS_t and DQS_c. The delay circuit 210 may include first and second delay lines 211 and 212. The first delay line 211 may receive the first strobe signal DQS_t from a first strobe pad 202, delay the received first strobe signal DQS_t, and output the delayed first strobe signal DQS_t_d. The first delay line 211 may have a delay value which is adjusted according to a delay code DCODE<0:N>. The second delay line 212 may receive the second strobe signal DQS_c from a second strobe pad 203, delay the received second strobe signal DQS_c, and output the delayed second strobe signal DQS_c_d. The second delay line 212 may have a delay value which is adjusted according to the delay code DCODE<0:N>. In various embodiments, the first and second delay lines 211 and 212 may have the same delay value. The first and second strobe signals DQS_t and DQS_c may have a phase difference of 180 degrees therebetween. That is, the second strobe signal DQS_c may correspond to the inverted signal of the first strobe signal DQS_t.

The first receiver circuit 221 may sample data DQ of a data pad 201 in synchronization with the delayed first strobe signal DQS_t_d. Specifically, the first receiver circuit 221 may generate first sampling data OUT_t by comparing the data DQ to the level of a reference voltage VREF at a rising edge of the delayed first strobe signal DQS_t_d. In various embodiments, the reference voltage VREF may have an intermediate level between a logic high level and a logic low level.

The second receiver circuit 222 may sample the data DQ of the data pad 201 in synchronization with the delayed second strobe signal DQS_c_d. Specifically, the second receiver circuit 222 may generate second sampling data OUT_c by comparing the data DQ to the level of the reference voltage VREF at a rising edge of the delayed second strobe signal DQS_c_d.

The enable signal generation circuit 230 may generate an enable signal EN indicating whether the data DQ transitioned. The enable signal generation circuit 230 may activate the enable signal EN when the first sampling data OUT_t from the first receiver circuit 221 and the second sampling data OUT_c from the second receiver circuit 222 are different from each other. When the first and second sampling data OUT_t and OUT_c are different from each other, it may indicate that the data DQ transitioned. In various embodiments, the enable signal generation circuit 230 may include an XOR gate which receives the first and second sampling data OUT_t and OUT_c, performs an XOR operation and outputs the enable signal EN in accordance with the result of the XOR operation.

The transition level generation circuit 240 may generate a transition level signal COM_ST indicating the transition direction of the data DQ. The transition level generation circuit 240 may generate the transition level signal COM_ST by sampling the first sampling data OUT_t in synchronization with the delayed second strobe signal DQS_c_d. In various embodiments, the transition level generation circuit 240 may include a D flip-flop which receives the first sampling data OUT_t through an input terminal D thereof, receives the delayed second strobe signal DQS_c_d through a clock terminal thereof, and outputs the transition level signal COM_ST through an output terminal Q thereof. When the enable signal EN is activated and the transition level signal COM_ST is at a high level, it may indicate that a logic level of the data DQ transitioned from high to low. When the enable signal EN is activated and the transition level signal COM_ST is at a low level, it may indicate that a logic level of the data DQ transitioned from low to high.

The phase shift circuit 250 may generate a shifted first strobe signal DQS_90 by shifting the delayed first strobe signal DQS_t_d by a certain degree, for example, 90 degrees. In various embodiments, the phase shift circuit 250 may include a delay circuit which has a delay value corresponding to ¼ of one cycle of the first strobe signal DQS_t. The phase shift circuit 250 may include two or more delay circuits to set a suitable delay value.

The sampling circuit 260 may sample the data DQ from the data pad 201 in synchronization with the shifted first strobe signal DQS_90. Specifically, the sampling circuit 260 may generate a sampling result SAMP by comparing the data DQ to the level of the reference voltage VREF at a rising edge of the shifted first strobe signal DQS_90.

The control logic 270 may generate the delay code DCODE<0:N> for deciding the delay value of the delay circuit 210. The control logic 270 may increase or decrease the value of the delay code DCODE<0:N> while the enable signal EN is activated, and fix the value of the delay code DCODE<0:N> while the enable signal EN is deactivated. In order to adjust the delay value of the delay circuit 210, i.e. the delay code DCODE<0:N>, the control logic 270 needs to recognize that edges (e.g., rising edges) of the delayed first and second strobe signals DQS_t_d and DQS_c_d lead or lag behind the center of the data DQ. However, when the data DQ do not transition, the control logic 270 cannot recognize that the rising edges of the delayed first and second strobe signals DQS_t_d and DQS_c_d lead or lag behind the center of the data DQ.

When the enable signal EN is activated, the control logic 270 may increase or decrease the value of the delay code DCODE<0:N> according to the levels of the transition level signal COM_ST and the sampling result SAMP. (1) When the transition level signal COM_ST is at a high level and the sampling result SAMP is at a low level, it may indicate that a logic level of the data DQ transitioned from high to low, and the data DQ was sampled as a low level at a rising edge of the shifted first strobe signal DQS_90. This may indicate that the rising edge of the delayed first strobe signal DQS_t_d lags behind the center of the data DQ. Therefore, the control logic 270 may decrease the delay value of the delay circuit 210 by decreasing the value of the delay code DCODE<0:N>. (2) When the transition level signal COM_ST is at a high level and the sampling result SAMP is at a high level, it may indicate that a logic level of the data DQ transitioned from high to low, and the data DQ was sampled as a high level at a rising edge of the shifted first strobe signal DQS_90. This may indicate that the rising edge of the delayed first strobe signal DQS_t_d leads the center of the data DQ. Therefore, the control logic 270 may increase the delay value of the delay circuit 210 by increasing the value of the delay code DCODE<0:N>. (3) When the transition level signal COM_ST is at a low level and the sampling result SAMP is at a low level, it may indicate that a logic level of the data DQ transitioned from low to high, and the data DQ was sampled as a low level at a rising edge of the shifted first strobe signal DQS_90. This may indicate that the rising edge of the delayed first strobe signal DQS_t_d leads the center of the data DQ. Therefore, the control logic 270 may increase the delay value of the delay circuit 210 by increasing the value of the delay code DCODE<0:N>. (4) When the transition level signal COM_ST is at a low level and the sampling result SAMP is at a high level, it may indicate that a logic level of the data DQ transitioned from low to high, and the data DQ was sampled as a high level at a rising edge of the shifted first strobe signal DQS_90. This may indicate that the rising edge of the delayed first strobe signal DQS_t_d lags behind the center of the data DQ. Therefore, the control logic 270 may decrease the delay value of the delay circuit 210 by decreasing the value of the delay code DCODE<0:N>.

The control logic 270 may operate in synchronization with a falling edge of the shifted strobe signal DQS_90. That is, the control logic 270 may check the levels of the enable signal EN, the transition level signal COM_ST and the sampling result SAMP at a falling edge of the shifted strobe signal DQS_90, in order to perform the above-described operation.

Table 1 below summarizes the operation of the control logic 270.

TABLE 1

| EN | H | | | | L |
|---|---|---|---|---|---|
| COM_ST | H | | L | | don't care |
| SAMP | H | L | H | L | don't care |
| DCODE<0:N> | +1 (increase) | −1 (decrease) | −1 (decrease) | +1 (increase) | FIX |

Figure 3:
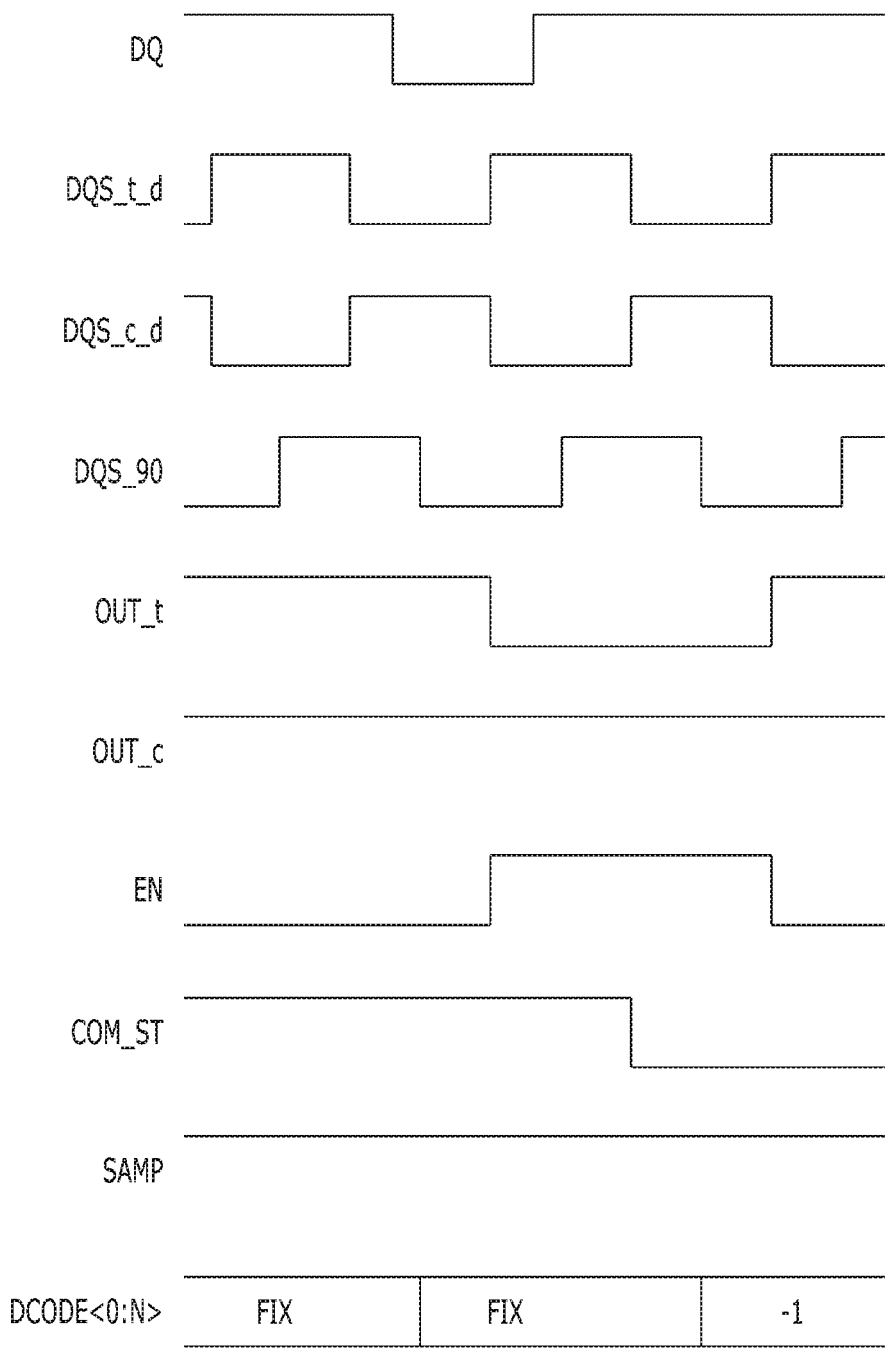
FIG. 3 is a timing diagram illustrating an example of an operation of a data receiver circuit in accordance with an embodiment of the present invention.

FIG. 3 is a timing diagram illustrating an operation of a data receiver circuit in accordance with an embodiment, for example, operation of the data receiver circuit 200 of FIG. 2 when rising edges of the delayed strobe signals DQS_t_d and DQS_c_d lag behind the center of the data DQ. Referring to FIG. 3, when the enable signal EN has a low level at a falling edge of the shifted strobe signal DQS_90, the value of the delay code DCODE<0:N> is fixed to the same value as the previous value. When the enable signal EN has a high level at a falling edge of the shifted strobe signal DQS_90, the value of the delay code DCODE<0:N> is adjusted to be decreased (i.e., "−1") because the transition level signal COM_ST is at a low level and the sampling result SAMP is at a high level. When the value of the delay code DCODE<0: N> is adjusted to "−1", the delay value of the delay circuit 210 may be reduced. Therefore, the rising edges of the delayed strobe signals DQS_t_d and DQS_c_d may become closer to the center of the data DQ.

Figure 4:
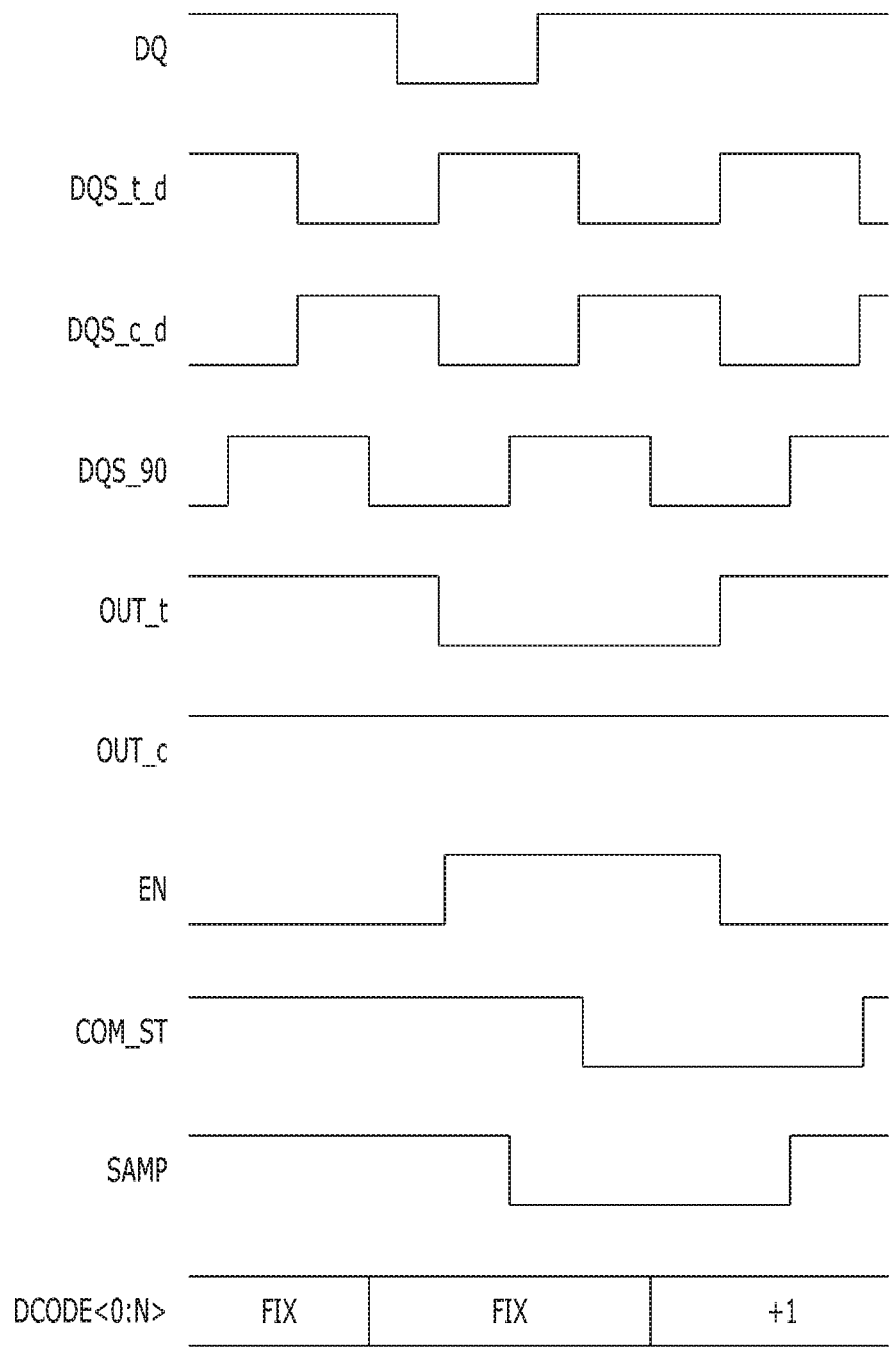
FIG. 4 is a timing diagram illustrating another example of an operation of a data receiver circuit in accordance with an embodiment of the present invention.

FIG. 4 is a timing diagram illustrating an example of an operation of a data receiver circuit in accordance with an embodiment, for example, operation of the data receiver circuit 200 of FIG. 2 when rising edges of the delayed strobe signals DQS_t_d and DQS_c_d lead the center of the data DQ. Referring to FIG. 4, when the enable signal EN has a low level at a falling edge of the shifted strobe signal DQS_90, the value of the delay code DCODE<0:N> is fixed to the same value as the previous value. When the enable signal EN has a high level at a falling edge of the shifted strobe signal DQS_90, the value of the delay code DCODE<0:N> is adjusted to be increased (i.e., "+1") because the transition level signal COM_ST is at a low level and the sampling result SAMP is at a low level. When the value of the delay code DCODE<0:N> is adjusted to "+1", the delay value of the delay circuit 210 may be increased. Therefore, the rising edges of the delayed strobe signals DQS_t_d and DQS_c_d may become closer to the center of the data DQ.

As described above, the data receiver circuit 200 may adjust the delay value of the delay circuit 210 such that the rising edges of the delayed strobe signals (e.g., DQS_t_d and DQS_c_d) are aligned with the center of the data (e.g., DQ), thereby retaining the optimal timing margin between the delayed strobe signals and the data.

In accordance with embodiments of the present invention, the data receiver circuit can align the data and the data strobe signal.

Although various embodiments have been described and illustrated, it will be apparent to those skilled in the art in light of such disclosure that various changes and modifications may be made without departing from the spirit and scope of the invention as defined in the following claims.

What is claimed is:

1. A data receiver circuit comprising:
    a delay circuit suitable for delaying first and second strobe signals and generating delayed first and second strobe signals;
    a first receiver circuit suitable for sampling data in synchronization with the delayed first strobe signal;
    a second receiver circuit suitable for sampling the data in synchronization with the delayed second strobe signal;
    an enable signal generation circuit suitable for generating an enable signal indicating whether the data transitioned;
    a transition level generation circuit suitable for generating a transition level signal indicating a transition direction of the data;
    a phase shift circuit suitable for shifting the phase of the delayed first strobe signal by a set degree and generating a shifted first strobe signal;
    a sampling circuit suitable for sampling the data in synchronization with the shifted first strobe signal and generating a sampling result; and
    a control logic suitable for changing a delay value of the delay circuit in response to the transition level signal and the sampling result of the sampling circuit, when the enable signal is activated.

2. The data receiver circuit of claim 1, wherein the delayed second strobe signal has a phase difference of 180 degrees from the delayed first strobe signal.

3. The data receiver circuit of claim 2, wherein the enable signal generation circuit activates the enable signal when the data sampled by the first receiver circuit and the data sampled by the second receiver circuit are different from each other.

4. The data receiver circuit of claim 2, wherein the enable signal generation circuit comprises an XOR gate suitable for receiving the data sampled by the first receiver circuit and the data sampled by the second receiver circuit, performing an XOR operation on the data sampled by the first and second receiver circuits and outputting the enable signal based on the result of the XOR operation.

5. The data receiver circuit of claim 2, wherein the transition level generation circuit generates the transition level signal by sampling the data sampled by the first receiver circuit in synchronization with the delayed second strobe signal.

6. The data receiver circuit of claim 5, wherein the transition level generation circuit comprises a D flip-flop suitable for receiving the data sampled by the first receiver circuit through an input terminal thereof, receiving the delayed second strobe signal through a clock terminal thereof, and outputting the transition level signal through an output terminal thereof.

7. The data receiver circuit of claim 2, wherein the control logic generates a delay code for changing a delay value of the delay circuit, the delay value being controlled by the delay code.

8. The data receiver circuit of claim 7, wherein the control logic increases or decreases the value of the delay code in response to the transition level signal and the sampling result of the sampling circuit, when the enable signal is activated, and retains the value of the delay code when the enable signal is deactivated.

9. The data receiver circuit of claim 8, wherein the control logic is operated in synchronization with a falling edge of the shifted first strobe signal.

10. The data receiver circuit of claim 9, wherein the control logic decreases the delay value of the delay circuit when the enable signal is activated, the transition level signal indicates that a logic level of the data transitioned from high to low, and the sampling result of the sampling circuit is at a low level, wherein the delay control logic increases the delay value of the delay circuit when the enable signal is activated, the transition level signal indicates that a logic level of the data transitioned from high to low, and the sampling result of the sampling circuit is at a high level, wherein the delay control logic increases the delay value of the delay circuit when the enable signal is activated, the transition level signal indicates that a logic level of the data transitioned from low to high, and the sampling result of the sampling circuit is at a low level, wherein the delay control logic decreases the delay value of the delay circuit when the enable signal is activated, the transition level signal indicates that a logic level of the data transitioned from low to high, and the sampling result of the sampling circuit is at a high level.

11. The data receiver circuit of claim 1, wherein the set degree by which the phase shift circuit shifts the phase of the delayed first strobe signal is 90 degrees.

12. A circuit comprising:

a delay circuit suitable for delaying first and second strobe signals by a set delay value and generating delayed first and second strobe signals;

a receiver circuit suitable for sampling data in synchronization with the delayed first strobe signal, and sampling the data in synchronization with the delayed second strobe signal;

a phase shift circuit suitable for shifting the phase of the delayed first strobe signal by a set degree and generating a shifted first strobe signal;

a sampling circuit suitable for sampling the data in synchronization with the shifted first strobe signal and generating a sampling result; and a control logic suitable for controlling the delay value of the delay circuit based on the sampling result of the sampling circuit when the data transitioned.

13. The circuit of claim 12, further comprising an enable signal generation circuit suitable for generating an enable signal indicating whether the data transitioned;

a transition level generation circuit suitable for generating a transition level signal indicating a transition direction of the data, wherein the control logic increases or decreases the delay value of the delay circuit based on the transition level signal and the sampling result of the sampling circuit when the enable signal is activated.

14. The circuit of claim 13, wherein the control logic generates a delay code for changing the delay value of the delay circuit and retains the delay value of the delay code when the enable signal is deactivated.

15. The circuit of claim 13, wherein the control logic is operated in synchronization with a falling edge of the shifted first strobe signal.

16. The circuit of claim 14, wherein the control logic decreases the delay value of the delay circuit when the enable signal is activated, the transition level signal indicates that a logic level of the data transitioned from high to low, and the sampling result of the sampling circuit is at a low level.

17. The circuit of claim 14, wherein the delay control logic increases the delay value of the delay circuit when the enable signal is activated, the transition level signal indicates that a logic level of the data transitioned from high to low, and the sampling result of the sampling circuit is at a high level.

18. The circuit of claim 14, wherein the delay control logic increases the delay value of the delay circuit when the enable signal is activated, the transition level signal indicates that a logic level of the data transitioned from low to high, and the sampling result of the sampling circuit is at a low level.

19. The circuit of claim 14, wherein the delay control logic decreases the delay value of the delay circuit when the enable signal is activated, the transition level signal indicates that a logic level of the data transitioned from low to high, and the sampling result of the sampling circuit is at a high level.

* * * * *